(12) United States Patent
Heller et al.

(10) Patent No.: US 10,766,767 B2
(45) Date of Patent: Sep. 8, 2020

(54) EUTECTIC BONDING WITH ALGE

(71) Applicant: Kionix, Inc., Ithaca, NY (US)

(72) Inventors: Martin Heller, Ithaca, NY (US); Toma Fujita, Ithaca, NY (US)

(73) Assignee: KIONIX, INC., Ithaca, NY (US)

( * ) Notice: Subject to any disclaimer, the term of this patent is extended or adjusted under 35 U.S.C. 154(b) by 0 days.

(21) Appl. No.: 16/407,045

(22) Filed: May 8, 2019

(65) Prior Publication Data

US 2019/0263656 A1 Aug. 29, 2019

Related U.S. Application Data

(62) Division of application No. 15/677,994, filed on Aug. 15, 2017.

(Continued)

(51) Int. Cl.
*B81C 1/00* (2006.01)
*B32B 15/04* (2006.01)
(Continued)

(52) U.S. Cl.
CPC ........ *B81C 1/00269* (2013.01); *B32B 15/043* (2013.01); *B32B 15/20* (2013.01);
(Continued)

(58) Field of Classification Search
CPC ......... H01L 24/01; H01L 24/02; H01L 24/03; H01L 24/05; H01L 24/06; B81C 1/00261; B81C 1/00269
See application file for complete search history.

(56) References Cited

U.S. PATENT DOCUMENTS 5,693,574 A 12/1997 Schuster et al.
5,905,203 A 5/1999 Flach et al.
(Continued)

FOREIGN PATENT DOCUMENTS

DE 102005042754 B4 9/2008
EP 126330 B1 7/2003
(Continued)

OTHER PUBLICATIONS

Eichler et al., "Plasma Activation as a Pretreatment Tool for Low-Temperature Direct Wafer Bonding in Microsystem Technology," ECS Transactions, 50(7):265-276, (2012).
(Continued)

*Primary Examiner* — Ermias T Woldegeorgis
(74) *Attorney, Agent, or Firm* — Alston & Bird LLP

(57) ABSTRACT

A MEMS device formed in a first semiconductor substrate is sealed using a second semiconductor substrate. To achieve this, an Aluminum Germanium structure is formed above the first substrate, and a polysilicon layer is formed above the second substrate. The first substrate is covered with the second substrate so as to cause the polysilicon layer to contact the Aluminum Germanium structure. Thereafter, eutectic bonding is performed between the first and second substrates so as to cause the Aluminum Germanium structure to melt and form an AlGeSi sealant thereby to seal the MEMS device. Optionally, the Germanium Aluminum structure includes, in part, a layer of Germanium overlaying a layer of Aluminum.

15 Claims, 16 Drawing Sheets

Related U.S. Application Data

(60) Provisional application No. 62/481,634, filed on Apr. 4, 2017.

(51) Int. Cl.

| | |
|---|---|
| *B32B 15/20* | (2006.01) |
| *H01L 23/02* | (2006.01) |
| *B81B 7/00* | (2006.01) |
| *H01L 23/00* | (2006.01) |

(52) U.S. Cl.
CPC ........ *B81B 7/0032* (2013.01); *B81C 1/00261* (2013.01); *H01L 23/02* (2013.01); *H01L 24/01* (2013.01); *H01L 24/02* (2013.01); *H01L 24/03* (2013.01); *H01L 24/05* (2013.01); *H01L 24/06* (2013.01); *H01L 24/07* (2013.01); *H01L 24/08* (2013.01); *H01L 24/09* (2013.01); *H01L 24/94* (2013.01); *B81B 2203/0315* (2013.01); *B81C 2203/019* (2013.01); *B81C 2203/0127* (2013.01); *B81C 2203/035* (2013.01)

(56) References Cited

U.S. PATENT DOCUMENTS

| | | | |
|---|---|---|---|
| 6,245,636 | B1 | 6/2001 | Maszara |
| 6,403,485 | B1 | 6/2002 | Quek et al. |
| 7,144,750 | B2 | 12/2006 | Ouellet et al. |
| 7,442,570 | B2 | 10/2008 | Nasiri et al. |
| 8,237,296 | B2 | 8/2012 | Hancer |
| 8,592,926 | B2 | 11/2013 | Montez et al. |
| 8,610,224 | B2 | 12/2013 | Naito et al. |
| 8,905,293 | B2 | 12/2014 | Liu et al. |
| 10,053,360 | B1 | 8/2018 | Heller |
| 10,167,191 | B2 | 1/2019 | Heller et al. |
| 2003/0067014 | A1 | 4/2003 | Tsuruta et al. |
| 2009/0191660 | A1 | 7/2009 | Christenson et al. |
| 2010/0181676 | A1* | 7/2010 | Montez ............... H01L 24/02 257/771 |
| 2012/0068325 | A1* | 3/2012 | Montez ............... H01L 23/10 257/684 |
| 2012/0205653 | A1 | 8/2012 | Nishikage et al. |
| 2012/0313235 | A1 | 12/2012 | Chu et al. |
| 2013/0068013 | A1 | 3/2013 | Beck et al. |
| 2013/0168740 | A1* | 7/2013 | Chen ............... B81C 1/00238 257/254 |
| 2015/0344299 | A1 | 12/2015 | Chang et al. |
| 2016/0061679 | A1 | 3/2016 | Adams et al. |
| 2016/0107881 | A1* | 4/2016 | Thompson ............ B81B 7/0064 257/418 |
| 2017/0057813 | A1 | 3/2017 | Shin et al. |
| 2018/0282153 | A1 | 10/2018 | Heller et al. |
| 2020/0041538 | A1 | 2/2020 | Hocking |
| 2020/0048078 | A1 | 2/2020 | Heller et al. |

FOREIGN PATENT DOCUMENTS

| | | |
|---|---|---|
| WO | WO 2018/187486 A1 | 10/2018 |
| WO | WO 2018/187490 A1 | 10/2018 |

OTHER PUBLICATIONS

Evertsson et al., "The thickness of native oxides on aluminum alloys and single crystals," Applied Surface Science, 349: 826-832, (2015).

Gabriel et al. "Lokale Plasma-Behandlung in einem Mask Aligner zur selektiven Veränderung der Oberfläche von Wafern Local plasma treatment in a Mask Aligner for selective wafer surface modification," Mikrosystemtechnik Kongress, pp. P8.24-P8.24, (2009). Abstract in English.

Gabriel et al., "Wafer direct bonding with ambient pressure plasma activation," Microsyst Technol, 12:397-400, (2006).

Heller et al., "Surface Preparation and Eutectic Wafer Bonding," Ecs Transactions, 75(9):229-239, (2016).

Jeurgens et al., "Determination of thickness and composition of aluminum-oxide overlayers on aluminum substrates," Applied Surface Science, 144-145:11-15, (1999).

Klages et al., "Surface Technology with Cold Microplasmas," Plasma Processes and Polymers, 4, 208-218, (2007).

McCalister et al., "The Al—Ge (Aluminum-Germanium) system," Bulletin of Alloy Phase Diagrams, 5:341-347, (1984). Errata 6(2):111-113 and 183-184, (1985).

Okamoto, "Al—Ge (Aluminum-Germanium)," Journal of Phase Equilibria, 19(1):86, (1998).

Onsia et al., "A Study of the Influence of Typical Wet Chemical Treatments on Germanium Wafer Surface," Solid State Phenomena, 103-104:27-30, (2005).

Sood, "Advanced Metal-Eutectic Bonding for High Volume MEMS WLP," IEEE MEMS Bay Area Meeting, 30 pages, (2014).

Sood, et al., "Al—Ge Eutectic Wafer Bonding and Bond Characterization for CMOS Compatible Wafer Packaging," ECS Transactions, 33(4):93-101, (2010).

Zavracky et al., "Patterned Eutectic Bonding with Al/Ge Thin Films for MEMS," SPIE, 2639:46-52, (1995).

U.S. Appl. No. 15/677,994, Ex Parte Quayle Action dated Jan. 16, 2020.

U.S. Appl. No. 15/685,879, Notice of Allowance dated Apr. 4, 2018.

U.S. Appl. No. 15/685,957, Notice of Allowance dated Aug. 31, 2018.

U.S. Appl. No. 15/677,994, Non-Final Office Action dated May 30, 2019.

WIPO Application No. PCT/US2018/026107, PCT International Preliminary Report on Patentability dated Oct. 8, 2019.

WIPO Application No. PCT/US2018/026107, PCT International Search Report and Written Opinion of the International Searching Authority dated Jun. 21, 2018.

WIPO Application No. PCT/US2018/026111, PCT International Preliminary Report on Patentability dated Oct. 8, 2019.

WIPO Application No. PCT/US2018/026111, PCT International Search Report and Written Opinion of the International Searching Authority dated Aug. 23, 2018.

WIPO Application No. PCT/US2018/046324, PCT International Search Report and Written Opinion of the International Searching Authority dated Sep. 14, 2018.

U.S. Appl. No. 15/677,994, Notice of Allowance dated Jun. 15, 2020.

* cited by examiner

EUTECTIC BONDING WITH ALGE

CROSS REFERENCES TO RELATED APPLICATION

This application is a Divisional Application of U.S. Non-Provisional Application No. 15/677,994, filed Aug. 15, 2017, which claims the benefit of U.S. Provisional Application No. 62/481,634, filed Apr. 4, 2017, the contents of which are incorporated herein by reference in their entirety.

FIELD OF THE INVENTION

The present invention relates to wafer bonding, and more particularly to eutectic bonding for sealing MEMS devices.

BACKGROUND

Micro Electro-Mechanical Systems (MEMS), such as motion sensors and movable mirrors, are being widely used. As is well known, a MEMS motion sensor may be, for example, an accelerometer for detecting linear motion, or a gyroscope for detecting rotation and angular velocity.

Advanced planar silicon processes are being increasingly used to manufacture MEMS devices. Glass frit bonding has been used for wafer-level packaging of MEMS devices, such as accelerometers. However, due to its limitation in achievable minimum seal width, cost, and lead content, a substantial number of the current generation of gyroscopes are made using other wafer-level packaging solutions, such as eutectic solder bonding.

To be effective, a eutectic wafer bonding processes require clean surfaces. Excessive amounts of native oxides and other organic contaminants on the surfaces may damage surface bond formation, strength, and integrity. Depending on the materials in the seal layer stack and device configurations, the removal of the native oxide layer and other contaminants from the surface being bonded may cause difficulties. Robust wafer bonding and sealing of MEMS devices using eutectic wafer bonding processes continues to pose challenges.

BRIEF SUMMARY OF THE INVENTION

A method of sealing a MEMS device formed in a first semiconductor substrate using a second semiconductor substrate, in accordance with one embodiment of the present invention, includes, in part, forming an Aluminum Germanium structure above the first substrate; forming a polysilicon layer above the second substrate; covering the first substrate with the second substrate so as to cause the polysilicon layer to contact the Aluminum Germanium structure; and performing eutectic bonding between the first and second substrates so as to cause the Aluminum Germanium structure to melt and form a AlGeSi sealant thereby to seal the MEMS device. In one embodiment, the Germanium Aluminum structure comprises a layer of Germanium overlaying a layer of Aluminum.

In one embodiment, the method further includes, in part, forming an adhesive layer below the Aluminum Germanium structure in the first substrate. In one embodiment, the method further includes, in part, forming an Alumina layer between the Aluminum Germanium structure and the adhesive layer. In one embodiment, the adhesive layer is a Titanium Nitride layer. In one embodiment, the method further includes, in part, forming an Alumina layer below the Polysilicon layer in the second substrate. In one embodiment, the method further includes, in part, forming a Polycide layer below the Polysilicon layer in the second substrate. In one embodiment, the method further includes, in part, forming an adhesive layer below the Alumina layer in the second substrate.

A method of sealing a MEMS device formed in a first semiconductor substrate using a second semiconductor substrate, in accordance with one embodiment of the present invention, includes, in part, forming a Silicide layer either in or above the first substrate; forming an Aluminum Germanium structure above the Silicide layer of the first substrate; forming a Silicide layer either in or above a substrate of the second substrate; covering the first substrate with the second substrate so as to cause the Aluminum Germanium structure of the first substrate to contact the Silicide layer of the second substrate; and performing eutectic bonding between the first and second substrates so as to cause the Aluminum Germanium structure to melt and form a AlGeSi sealant thereby to seal the MEMS device.

A method of sealing a MEMS device formed in a first semiconductor substrate using a second semiconductor substrate, in accordance with one embodiment of the present invention, includes, in part, forming a Silicide layer either in or above the second substrate; forming an Aluminum Germanium structure above the Silicide layer of the second substrate; covering the first substrate with the second substrate so as to cause the Aluminum Germanium structure of the second substrate to contact the Silicide layer of the first substrate; and performing eutectic bonding between the first and second substrates so as to cause the Aluminum Germanium structure to melt and form a AlGeSi sealant thereby to seal the MEMS device.

A method of sealing a MEMS device formed in a first semiconductor substrate using a second semiconductor substrate, in accordance with one embodiment of the present invention, includes, in part, forming a Silicide layer either in or above a substrate of the first substrate; forming an Aluminum Germanium structure above the Silicide layer of the first substrate; forming a Silicide layer either in or above a substrate of the second substrate; forming an Aluminum Germanium structure above the Silicide layer of the second substrate; covering the first substrate with the second substrate so as to cause the Aluminum Germanium structure of the first substrate to contact the Aluminum Germanium structure of the first substrate; and performing eutectic bonding between the first and second substrates so as to cause the Aluminum Germanium structure to melt and form a AlGeSi sealant thereby to seal the MEMS device.

A method of sealing a MEMS device formed in a first semiconductor substrate using a second semiconductor substrate, in accordance with one embodiment of the present invention, includes, in part, forming a Silicide layer either in or above a substrate of the first substrate; forming an Aluminum Germanium structure above the Silicide layer of the first substrate; forming a Silicide layer either in or above a substrate of the second substrate; forming an Aluminum structure above the Silicide layer of the second substrate; covering the first substrate with the second substrate so as to cause the Aluminum Germanium structure of the first substrate to contact the Aluminum structure of the second substrate; and performing eutectic bonding between the first and second substrates so as to cause the Aluminum Germanium structure to melt and form a AlGeSi sealant thereby to seal the MEMS device.

A method of sealing a MEMS device formed in a first semiconductor substrate using a second semiconductor substrate, in accordance with one embodiment of the present invention, includes, in part, forming a Silicide layer either in or above a substrate of the first substrate; forming a Germanium structure above the Silicide layer of the first substrate; forming a Silicide layer either in or above a substrate of the second substrate; forming an Aluminum Germanium structure above the Silicide layer of the second substrate; covering the first substrate with the second substrate so as to cause the Aluminum Germanium structure of the second substrate to contact the Germanium structure of the first substrate; and performing eutectic bonding between the first and second substrates so as to cause the Aluminum Germanium structure to melt and form a AlGeSi sealant thereby to seal the MEMS device.

A MEMS structure, in accordance with one embodiment of the present invention, includes, in part, a MEMS device formed in a cavity of a first semiconductor substrate and sealed in an AlGeSi sealant. The AlGeSi sealant is formed in response to eutectic bonding between an Aluminum Germanium structure formed in the first substrate and a polysilicon layer formed in a second semiconductor substrate.

In one embodiment, the Germanium Aluminum structure further includes, in part, a layer of Germanium overlaying a layer of Aluminum. In one embodiment, the MEMS structure further includes, in part, an adhesive layer below the Aluminum Germanium structure. In one embodiment, the MEMS structure further includes, in part, an Alumina layer disposed between the Aluminum Germanium structure and the adhesive layer. In one embodiment, the adhesive layer is a Titanium Nitride layer. In one embodiment, the MEMS structure further includes, in part, an Alumina layer below the Polysilicon layer in the second substrate. In one embodiment, the MEMS structure further includes, in part, a Polycide layer below the Polysilicon layer in the second substrate. In one embodiment, the MEMS structure further includes, in part, an adhesive layer below the Alumina layer in the second substrate.

A MEMS structure, in accordance with one embodiment of the present invention, includes, in part, a MEMS device formed in a cavity of a first semiconductor substrate and sealed in an AlGeSi sealant. The AlGeSi sealant is formed in response to a eutectic bonding between an Aluminum Germanium structure formed in the first substrate and a Silicide layer formed either in or above the second semiconductor substrate.

A MEMS structure, in accordance with one embodiment of the present invention, includes, in part, a MEMS device formed in a cavity of a first semiconductor substrate and sealed in an AlGeSi sealant. The AlGeSi sealant is formed in response to a eutectic bonding between an Aluminum Germanium structure formed in a second semiconductor substrate and a Silicide layer formed either in or above the first semiconductor substrate.

A MEMS structure, in accordance with one embodiment of the present invention, includes, in part, a MEMS device formed in a cavity of a first semiconductor substrate and sealed in an AlGeSi sealant. The AlGeSi sealant is formed in response to a eutectic bonding between a first Aluminum Germanium structure formed in the first semiconductor substrate, a second Aluminum Germanium structure formed in a second semiconductor substrate and a Silicide layer formed either in or above the first semiconductor substrate.

A MEMS structure, in accordance with one embodiment of the present invention, includes, in part, a MEMS device formed in a cavity of a first semiconductor substrate and sealed in an AlGeSi sealant. The AlGeSi sealant is formed in response to a eutectic bonding between a first Aluminum Germanium structure formed in the first semiconductor substrate, a second Aluminum Germanium structure formed in a second semiconductor substrate and a Silicide layer formed either in or above the second semiconductor substrate.

A MEMS structure, in accordance with one embodiment of the present invention, includes, in part, a MEMS device formed in a cavity of a first semiconductor substrate and sealed in an AlGeSi sealant. The AlGeSi sealant is formed in response to a eutectic bonding between a first Aluminum Germanium structure formed in the first semiconductor substrate, an Aluminum structure formed in a second semiconductor substrate, and a Silicide layer formed either in or above the first semiconductor substrate.

A MEMS structure, in accordance with one embodiment of the present invention, includes, in part, a MEMS device formed in a cavity of a first semiconductor substrate and sealed in an AlGeSi sealant. The AlGeSi sealant is formed in response to a eutectic bonding between a first Aluminum Germanium structure formed in the first semiconductor substrate, an Aluminum structure formed in a second semiconductor substrate, and a Silicide layer formed either in or above the second semiconductor substrate.

DETAILED DESCRIPTION OF THE INVENTION

In accordance with one embodiment of the present invention, A MEMS device (alternatively referred to herein as sensor) is hermetically sealed in a cavity by applying Aluminum-Germanium-Silicon (AlGeSi) eutectic wafer bonding between a first silicon wafer in which the MEMS device is formed (hereinafter referred to as device wafer) and a second silicon wafer (hereinafter referred to as lid wafer) covering the top surface of the device wafer. To achieve this, the eutectic wafer bonding is adapted to enable a structure that includes Aluminum and/or Germanium, formed on either the device wafer, the lid wafer, or both, to bond with Silicon atoms present in a structure/region of either the device wafer, the lid wafer, or both, to form a strong AlGeSi sealant sealing/encasing the MEMS device. The processing steps for forming the device wafer and the lid wafer, in accordance with a number of exemplary embodiments of the present invention, are described below.

Figure 1:
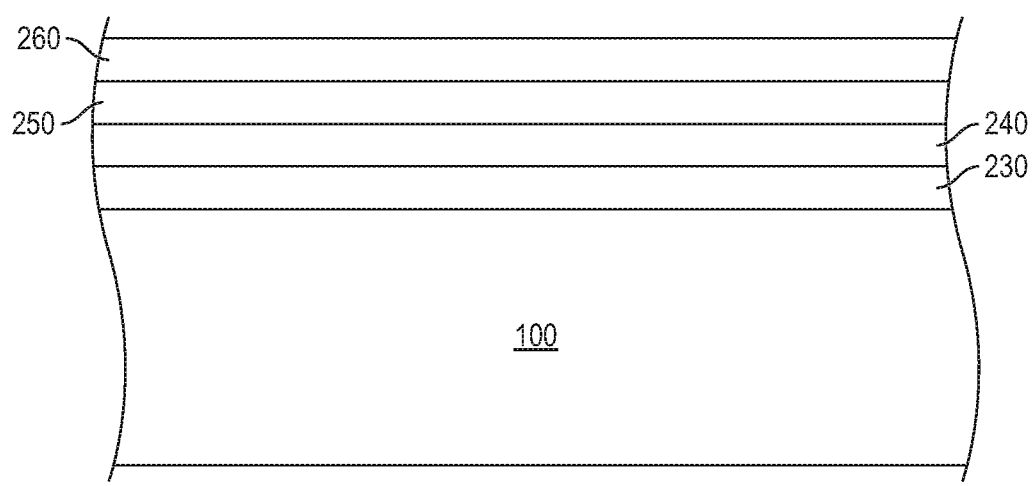
FIG. 1 is a cross-sectional view of a device wafer following the formation of multiple layers thereon, in accordance with one exemplary embodiment of the present invention.

FIG. 1 is a cross-sectional view of a device wafer (also referred to herein as substrate) 100 following the formation of multiple layers thereon, in accordance with one exemplary embodiment of the present invention. Device wafer 100 is shown as including, in part, an adhesion layer 230, which may be a Titanium Nitride TiN layer having a thickness ranging, for example, from 100 nm to 200 nm. Device wafer 100 is also shown as including a layer 240 of Alumina (Al2O3), having a thickness ranging, for example, from 100 nm to 200 nm, and formed above adhesion layer 230. Both TiN layer 230 and Alumina layer 240 may be deposited using well known techniques, such as ALD, CVD or PVD processes.

Device wafer 100 is also shown as including an Aluminum layer 250 overlaying Alumina layer 240, and a Germanium layer 260 overlaying Aluminum layer 250. The thicknesses of Aluminum layer 250 and Germanium layer 260 are selected so as to enable eutectic bonding to take place when the required temperature and pressure are applied. For example, Aluminum layer 250 and Germanium layer 260 may be selected to have thicknesses of 980 nm and 530 nm, respectively.

Figure 2A:
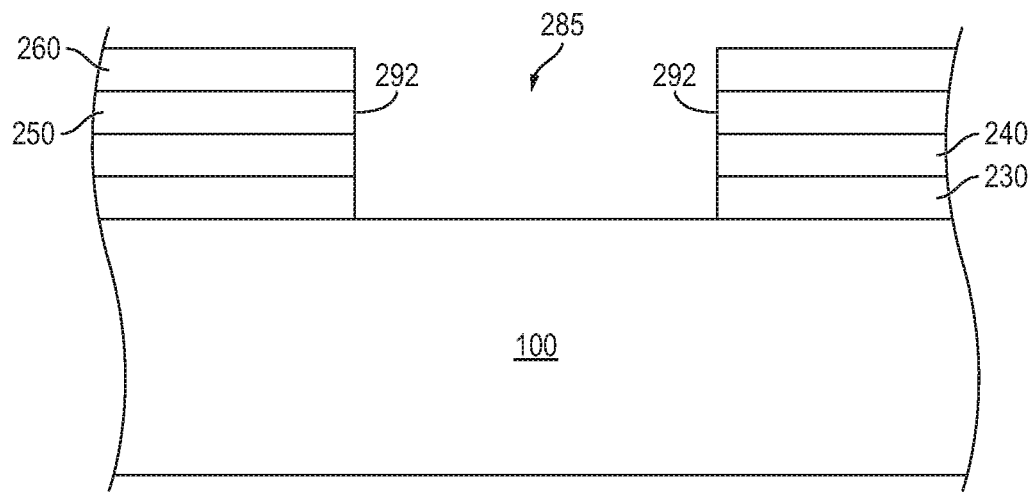
FIG. 2A is a cross-sectional view of the device wafer of FIG. 1 after a number of patterning and etching steps, in accordance with one exemplary embodiment of the present invention.

Thereafter, using conventional patterning and etching processing steps, layers 230, 240, 250, and 260 are removed to form an opening 285 having sidewalls 292, as shown in FIG. 2A.

Figure 2B:
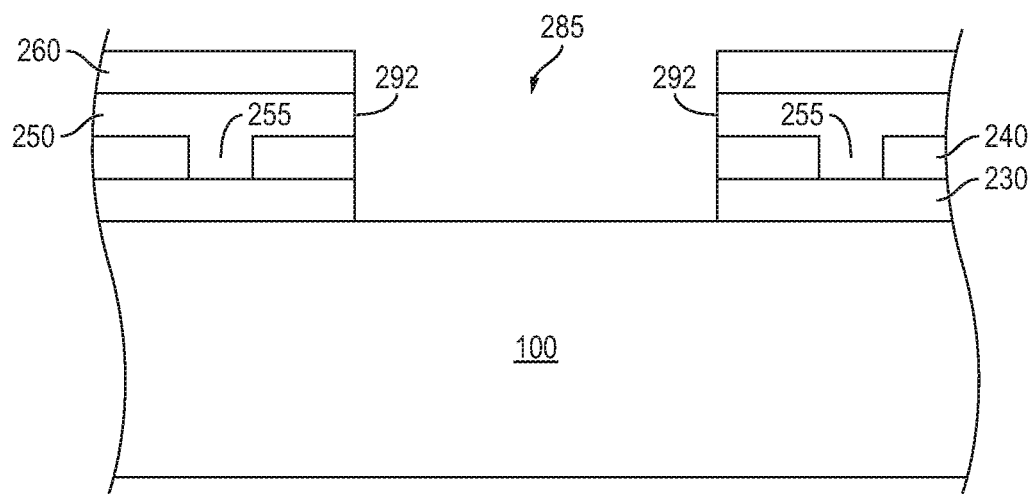
FIG. 2B is a cross-sectional view of the device wafer of FIG. 1 after a number of patterning and etching steps, in accordance with one exemplary embodiment of the present invention.

The device structure shown in FIG. 2B is similar to the device structure shown in FIG. 2A except that in FIG. 2B, an opening 255 is formed in Alumina 240 to enhance electrical connection between Titanium Nitride layer 230 undelaying Alumina layer 240, and Aluminum layer 250 and Germanium layer 260 overlaying Alumina layer 240.

Figure 3A:
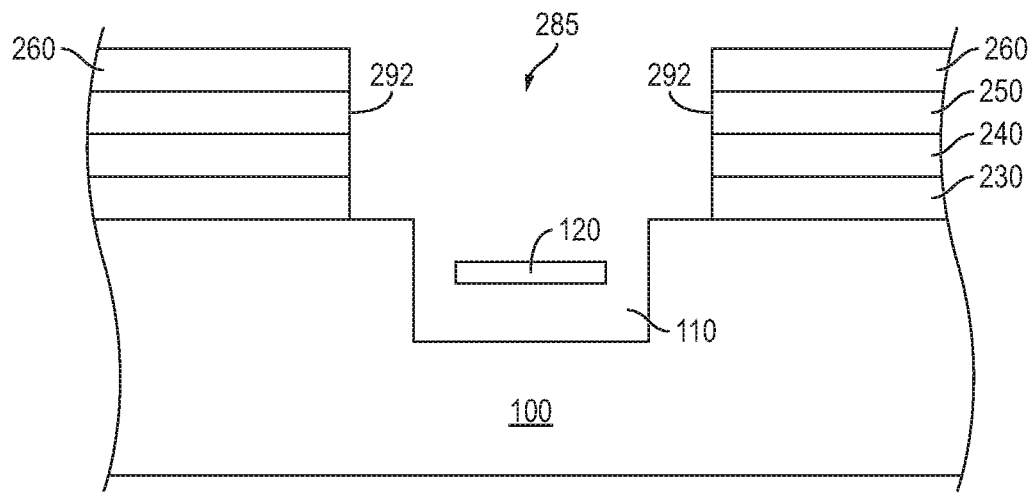
FIGS. 3A and 3B respectively are cross-sectional and top views of the device wafer of FIG. 2A after the formation of a MEMS device in a cavity of the device wafer, in accordance with one exemplary embodiment of the present invention.
Figure 3B:
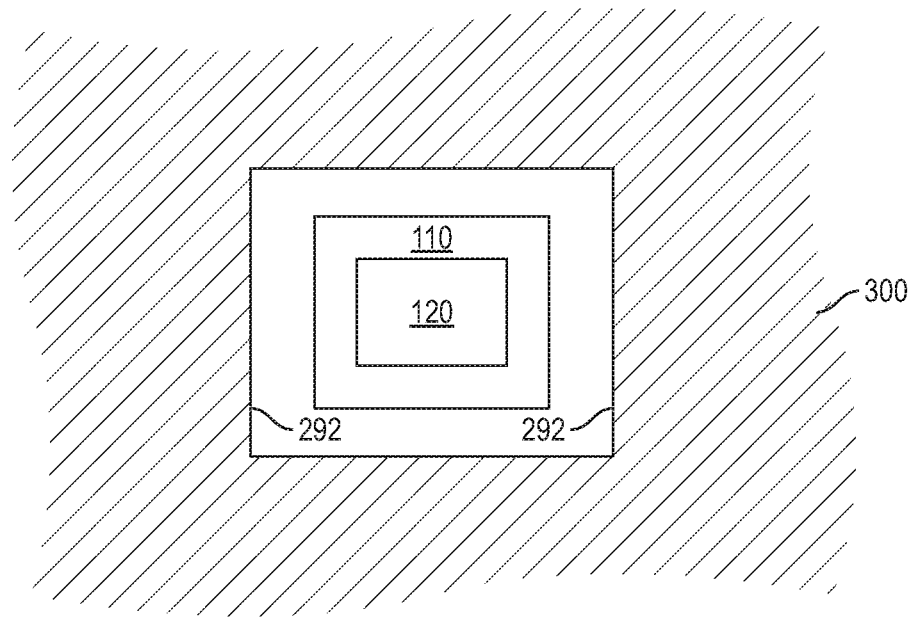

Next, as shown in FIG. 3A, a cavity 110 is formed at opening 285 in Silicon substrate in which MEMS device 120 is formed using any one of a number of conventional semiconductor processing techniques. FIG. 3B is a top view of device wafer 100 shown in FIG. 3A. It is understood that cross-hatched region 300 in FIG. 3B corresponds to layers 230, 240, 250 and 260 of FIG. 3A.

Figure 4A:
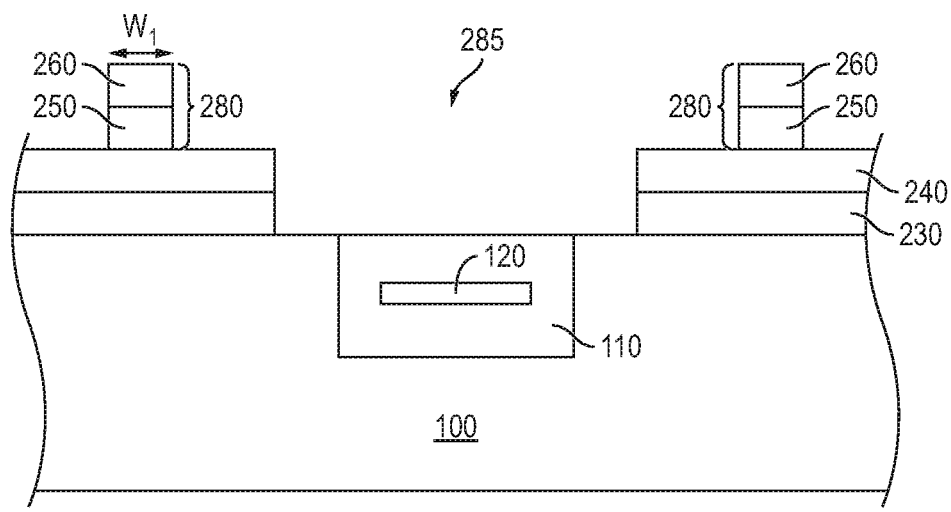
FIGS. 4A and 4B respectively are cross-sectional and top views of the device wafer of FIGS. 3A-3B following a number of patterning and etching steps to form an AlGe structure thereon, in accordance with one exemplary embodiment of the present invention.
Figure 4B:
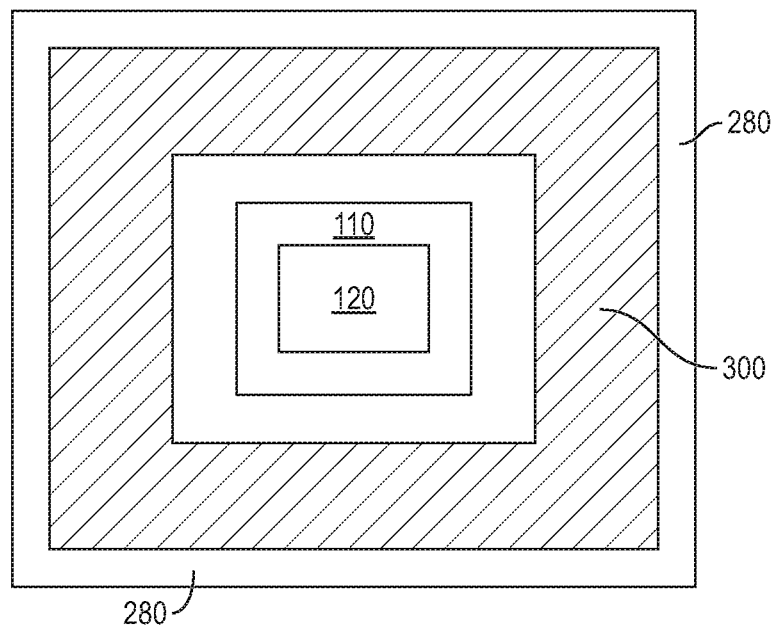

Thereafter, using conventional patterning and etching processes, Aluminum (Al) layer 250, and Germanium (Ge) layer 260 are etched to form an AlGe structure 280 around the periphery of cavity 110. FIGS. 4A and 4B respectively are cross-sectional and top views of device wafer 100 after the patterning and etching processes are carried out to form an AlGe structure 280.

Figure 5:
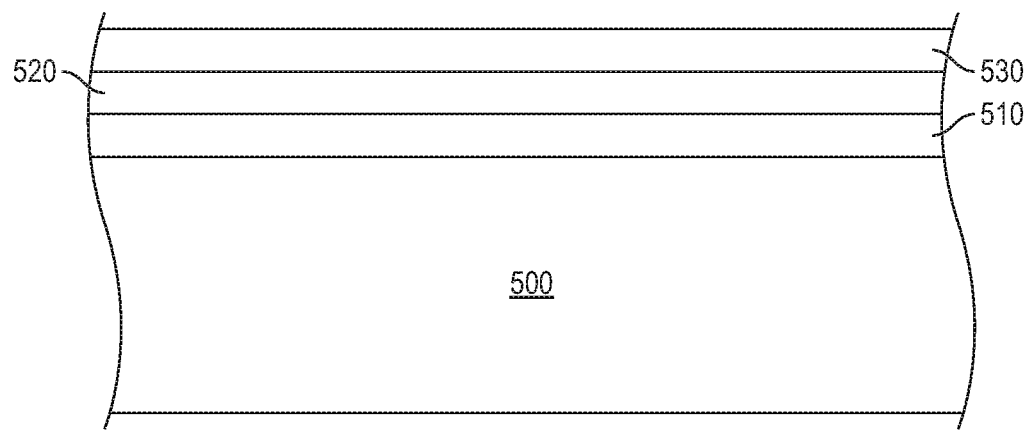
FIG. 5 is a cross-sectional view of a lid wafer adapted to cover the device wafer of FIGS. 4A-4B following the formation of multiple layers thereon, in accordance with one exemplary embodiment of the present invention.

FIG. 5 is a cross-sectional view of lid wafer 500 adapted to cover device wafer 100 to hermetically seal cavity 110 and device 120, in accordance with one exemplary embodiment of the present invention. Lid wafer 500 is shown as including an adhesion layer 510, an Alumina layer 520, and a Polysilicon layer 530. Adhesion layer 520 may include Titanium nitride TiN, having a thickness ranging, for example, from 100 nm to 200 nm. Alumina layer 520 may have a thickness ranging, for example, from 20 nm to 100 nm. Polysilicon layer 530 may have a thickness ranging, for example, from 100 nm to 150 nm. In one embodiment, layer 520 may be a Polycide layer in place of an Alumina layer. A Polycide layer may be a WSi layer, a MoSi layer, a CoSi layer, a NiSi layer, and the like.

Figure 6A:
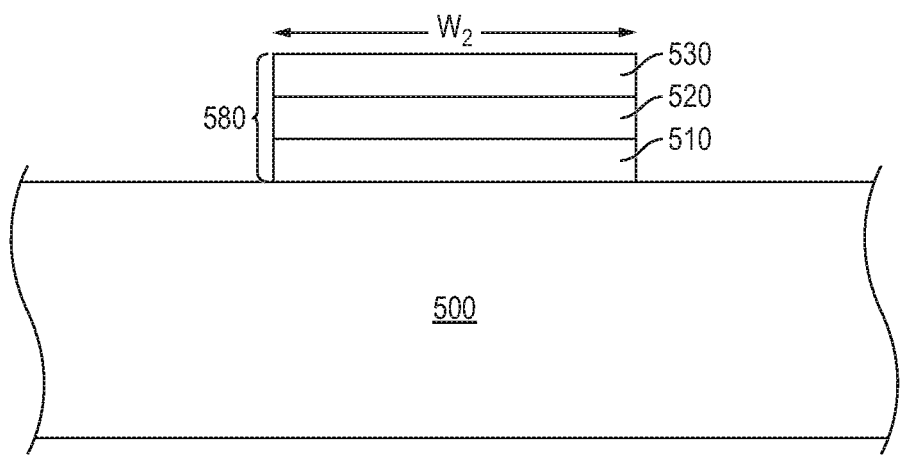
FIGS. 6A and 6B respectively are cross-sectional and top views of the lid wafer of FIG. 5 following a number of patterning and etching steps, in accordance with one exemplary embodiment of the present invention.
Figure 6B:
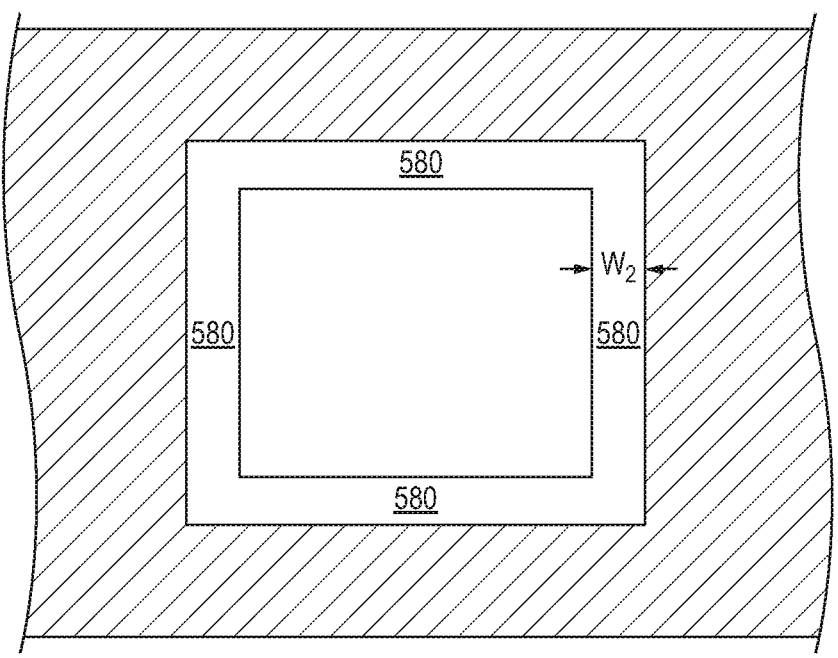

To prepare lid wafer 500 as a cover for device wafer 100, using conventional patterning and etching processes, layers 510, 520 and 530 are etched to form a structure 580, as shown in FIG. 6A. The width W2 of step structure 580 may be greater than width $W_1$ of step structure 280 shown in FIG. 4A. FIG. 6B is a top view of lid wafer 500 shown in FIG. 6A.

Figure 7A:
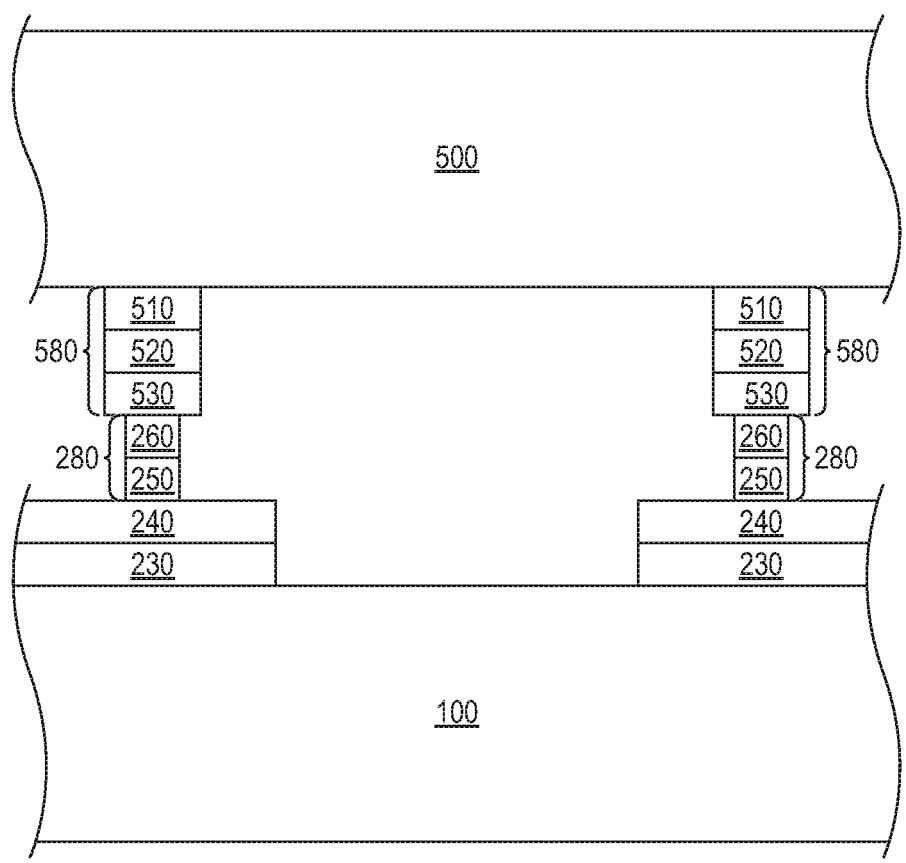
FIG. 7A is a cross-sectional view of the lid wafer of FIG. 6A covering the device wafer of FIG. 4A, in accordance with one exemplary embodiment of the present invention.

To hermetically seal MEMS device 120, as seen from FIG. 7A, the top surface of device wafer 100—shown in FIGS. 4A, 4B—is brought into contact with the top surface of lid wafer 500—shown in FIGS. 6A and 6B. This is achieved by placing lid wafer 500 over device wafer 100 so as to bring step structures 280 and 580 into alignment. Alternatively, to hermetically seal MEMS device 120, device wafer 100 may be placed over lid wafer 500.

Thereafter, during a eutectic bonding when the required heat and pressure are applied, Aluminum and Germanium disposed in structure 280 change their phases from solid to liquid to form an AlGe eutectic melt which subsequently reacts with the Silicon atoms present in the Polysilicon layer 530 to form a ternary AlGeSi. The AlGeSi so formed wets the undelaying Polycide or Alumina layer.

Incorporating Silicon atoms into the AlGe eutectic melt, in accordance with embodiments of the present invention, increases the eutectic point temperature thus solidifying the melt while controlling and limiting its flow. Alumina layer 240 provides a barrier against gas permeation and the highly reactive eutectic melt. The Alumina also provides a suitable adhesion layer for the eutectic melt. In embodiments in which layer 240 includes Polycide, the Polycide further acts as a barrier against the conduction diffusion and the highly reactive eutectic melt. The Silicide layer reduces the reaction speed of the AlGe eutectic melt with the silicon contained in the silicide layer. In other words, the rate of silicon incorporation into the liquid AlGe eutectic melt is made slower to provide a more controlled transformation from an AlGe eutectic melt into a tertiary AlGeSi. Any excessive uptake of Si and the resulting spike of Al or Ge into Silicon can be avoided or substantially reduced. A silicon layer (amorphous, polysilicon or any other type) on top of the silicide layer can be used as an initial, easily accessible silicon source for the AlGe eutectic melt to start the silicon incorporation into the AlGe eutectic melt at a high rate, slowing down after the layer is completely dissolved. The silicide acts as a diffusion barrier to reduce the undesirablet diffusion of Al and Ge atoms away from the liquid eutectic melt into the layers below. The silicide layer further acts as an adhesion layer for the AlGe eutectic melt. A device substrate together with a lid substrate sealing a MEMS device, in accordance with the embodiments of the present invention, is alternatively referred to herein as a MEMS structure.

Figure 7B:
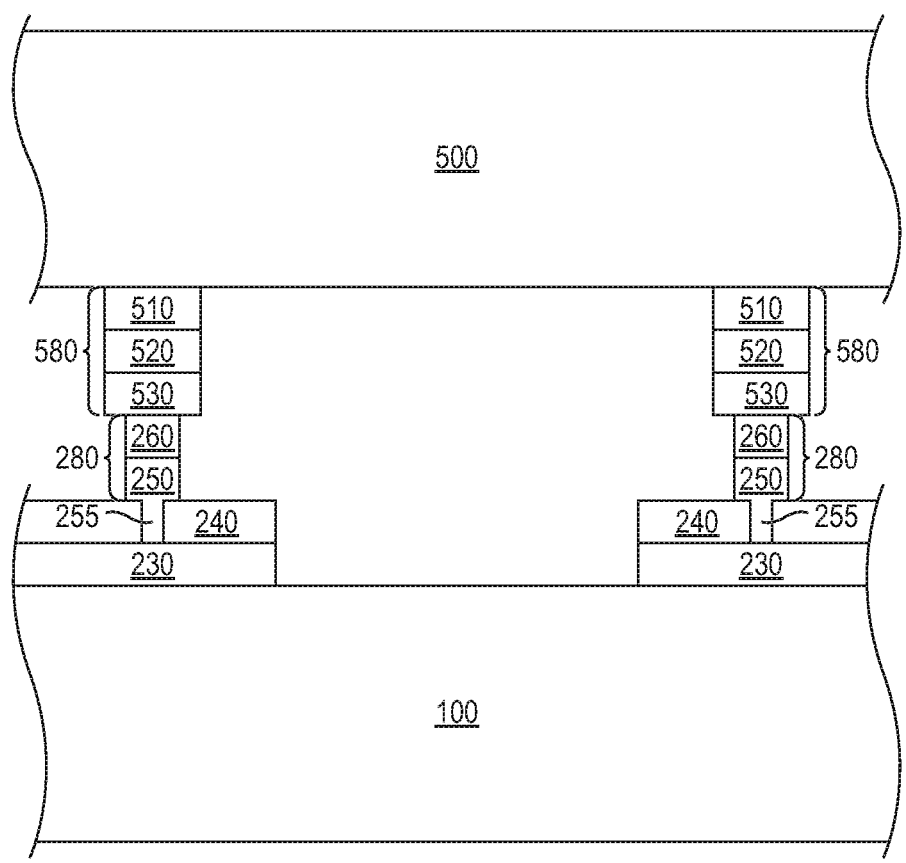
FIG. 7B is a cross-sectional view of the lid wafer of FIG. 6A covering the device wafer of FIG. 4A, in accordance with another exemplary embodiment of the present invention.

The device structure shown in FIG. 7B is similar to the device structure shown in FIG. 7A except that in FIG. 7B, an opening 255 is formed in Alumina 240 to enhance the electrical connection between adhesion layer 230, which may be for example, Titanium Nitride TiN layer as described above or a Silicide layer as described further below, and Aluminum layer 250 and Germanium layer 260 overlaying Alumina layer 240.

Figure 8A:
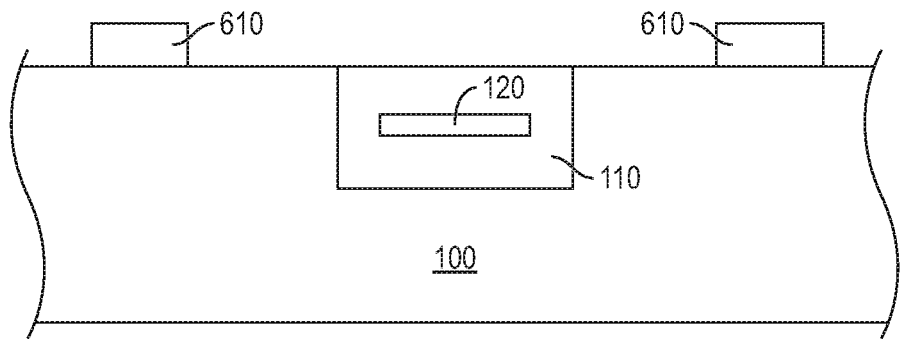
FIGS. 8A and 8B are simplified cross-sectional and top views of a device wafer after it has been processed to include a MEMS device and a Silicide structure, in accordance with one exemplary embodiment of the present invention.
Figure 8B:
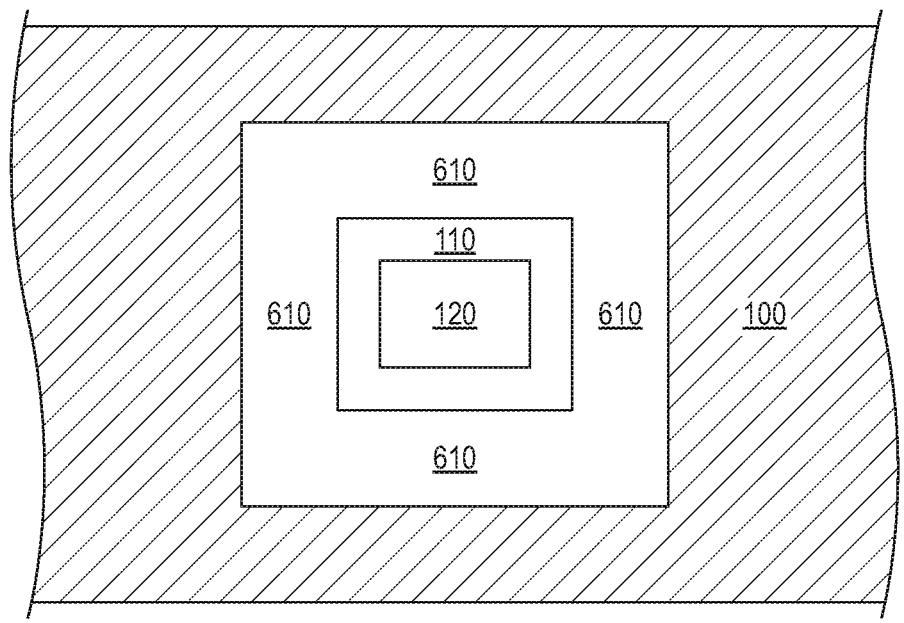

In accordance with one embodiment of the present invention, a Silicide layer formed and patterned on the device wafer, the lid wafer, or both, provides the Silicon atoms for the AlGe eutectic melt, as described further below. FIG. 8A is a simplified cross-sectional view of an exemplary device wafer 100 after it has been processed to include a Silicide step structure 610, as well as a MEMS device 120 in its associated cavity 110. FIG. 8B is a corresponding top view of device wafer 100 showing Silicide step structure 610, cavity 110 and MEMS device 120.

Figure 9A:
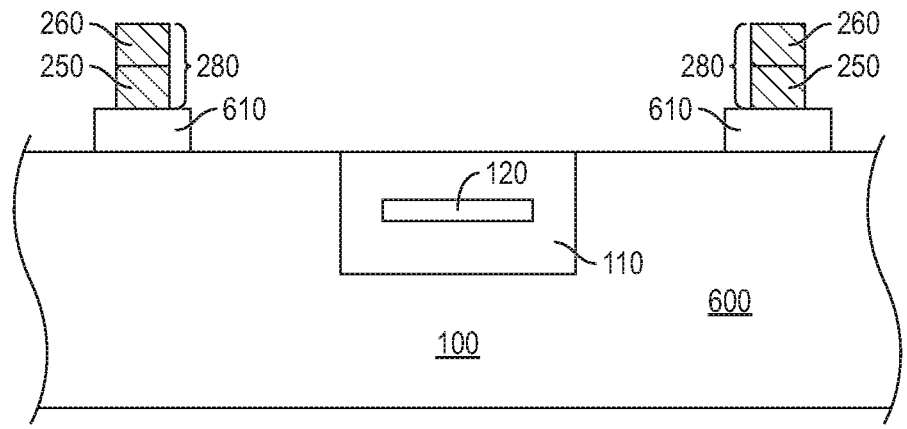
FIGS. 9A and 9B are cross-sectional and top views of the device wafer of FIGS. 8A-8B, following a number of depositions, patterning and etching steps, in accordance with one exemplary embodiment of the present invention.
Figure 9B:
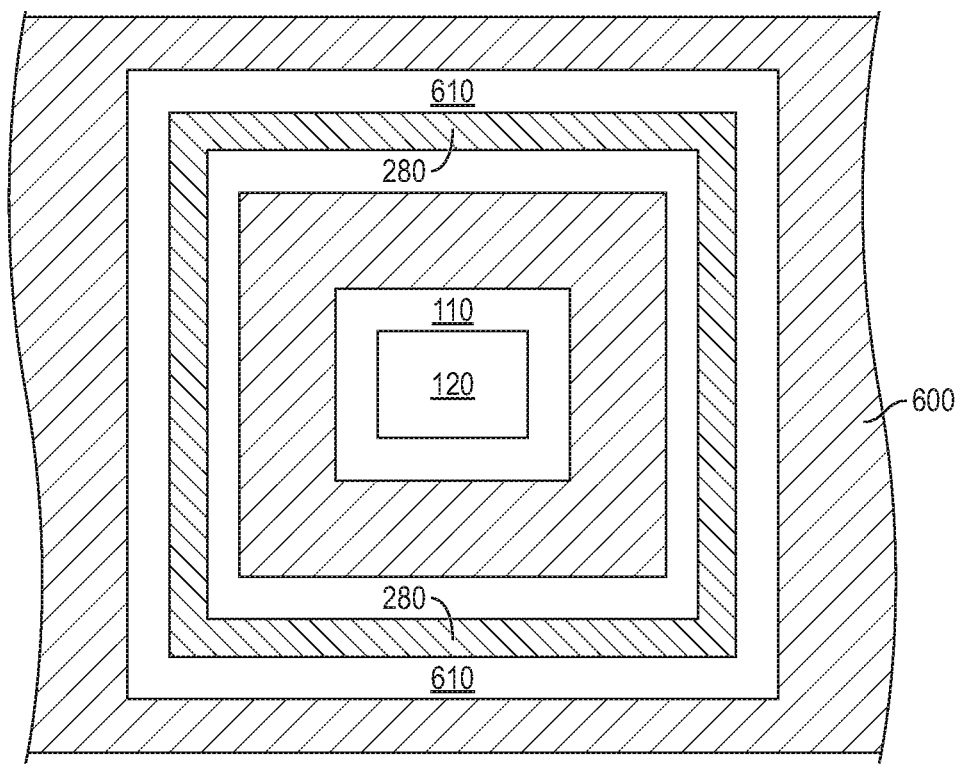

To prepare device wafer 100 for sealing, an Aluminum layer 250 followed by a Germanium layer 260 are deposited on Silicide step structure 610. The Aluminum and Germanium layers 250, 260 are subsequently patterned and etched to form a structure 280. FIGS. 9A and 9B respectively are cross-sectional and top views of device wafer 100 after the patterning and etching processes are carried out to form structure 280.

Figure 10A:
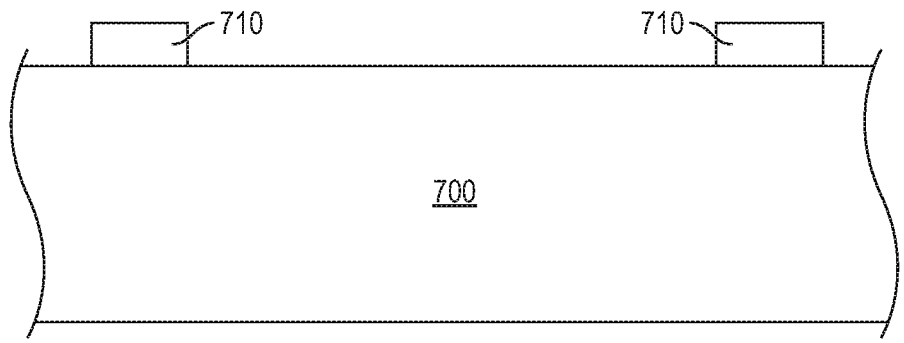
FIGS. 10A and 10B are cross-sectional and top views of a lid wafer adapted to cover the device wafer of FIGS. 9A-9B following deposition and etching steps, in accordance with one exemplary embodiment of the present invention.
Figure 10B:
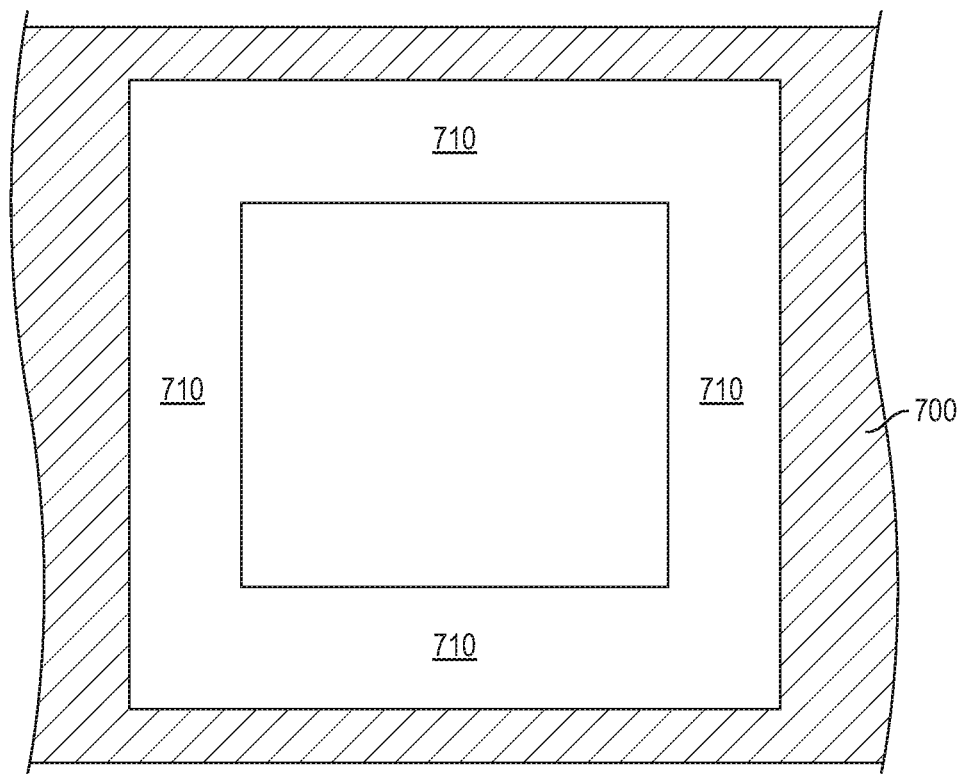

FIG. 10A is a cross-sectional view of a lid wafer 700 adapted to cover device wafer 100 of FIG. 9B to hermetically seal cavity 110 and device 120, in accordance with one exemplary embodiment of the present invention. To prepare lid wafer 700 as a cover for device wafer 100, using conventional patterning and etching processes, Silicide structure 710 is formed on the surface of the lid wafer. FIG. 10B is a corresponding top view of device wafer 700 showing Silicide structure 710 on its top surface.

Figure 11:
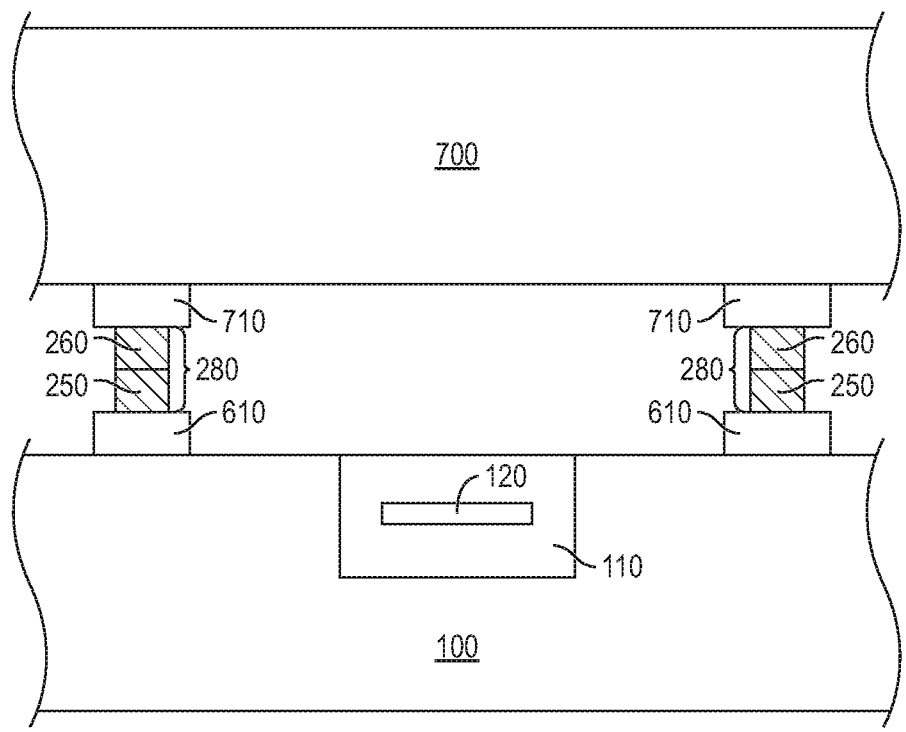
FIG. 11 is a cross-sectional view of the lid wafer of FIG. 10A covering the device wafer of FIG. 9A, in accordance with one exemplary embodiment of the present invention.

As seen from FIG. 11, to hermetically seal MEMS device 120, the top surface of device wafer 100—shown in FIGS. 9A, 9B—is brought into contact with the top surface of lid wafer 700—shown in FIGS. 10A and 10B. This is achieved by placing lid wafer 700 over device wafer 100 so as to bring Silicide structures 610 and 710 into alignment. Alternatively, to hermetically seal MEMS device 120, device wafer 100 may be placed over lid wafer 700.

To seal MEMS device 100, during a eutectic bonding when the required heat and pressure are applied, Aluminum and Germanium in structure 280 change their phases from solid to liquid to form an AlGe eutectic melt which subsequently reacts with the Silicon atoms present in Silicide structures 610 and/or 710 to form a ternary AlGeSi. Incorporating Silicon atoms into the AlGe eutectic melt, in accordance with embodiments of the present invention, increases the eutectic point temperature thus solidifying the melt and controlling/limiting its flow.

Although device wafer 100 of FIGS. 9A-9B is shown as including only a Silicide layer 610 disposed between the surface of its substrate and Aluminum layer 250, it is understood that in other embodiments one or more layers that include other materials (not shown) may be disposed between the surface of Silicon substrate 100 and Silicide structure 610. Furthermore, although device wafer 100 of FIGS. 9A-9B is shown as including only a single layer of Aluminum and Germanium, it is understood that in other embodiments (not shown), device wafer 100 may include multiple layers of Aluminum and Germanium deposited thereon in an alternating manner. Moreover, although cover wafer 700 of FIGS. 10A-10B is shown as including only a Silicide structure 710 above its substrate surface, it is understood that in other embodiments, one or more layers that include other materials (not shown) may be disposed between the surface of the Silicon substrate 700 and Silicide structure 710.

Figure 12:
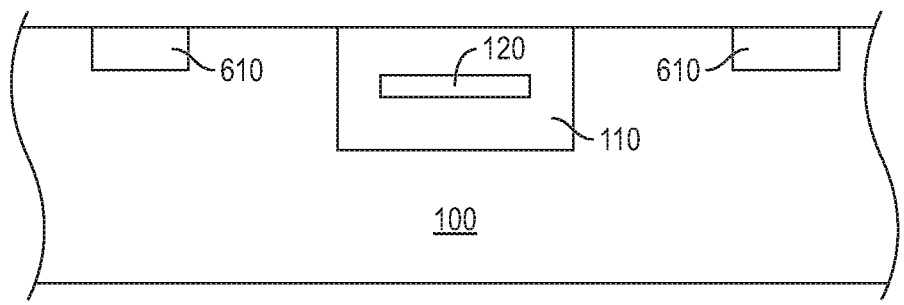
FIG. 12 is a simplified cross-sectional view of a device wafer after it has been processed to include a MEMS device and a Silicide region, in accordance with one exemplary embodiment of the present invention.

In accordance with another embodiment of the present invention, a Silicide region formed and patterned within the substrate of the device wafer, the lid wafer, or both, provides the Silicon atoms for the AlGe eutectic melt, as described further below. FIG. 12 is a simplified cross-sectional view of a device wafer 100 after it has been processed to include a Silicide region 610, as well as a MEMS device 120 in its associated cavity 110.

Figure 13A:
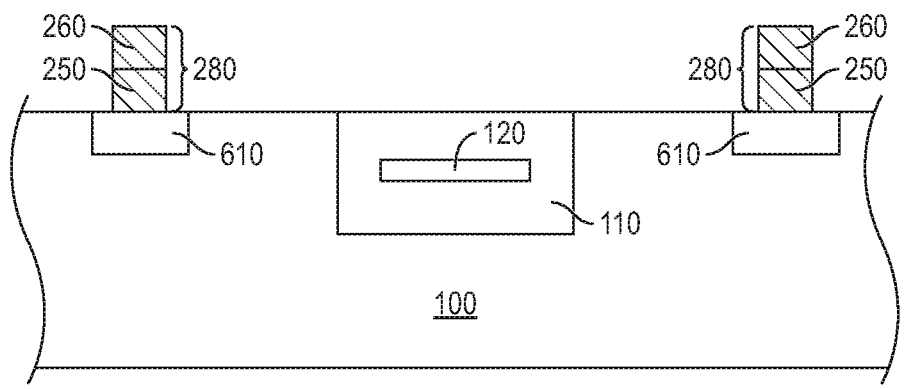
FIGS. 13A and 13B are cross-section and top views of the device wafer of FIG. 12 after performing a number of processing steps to form an Aluminum and Germanium structure thereon, in accordance with one exemplary embodiment of the present invention.
Figure 13B:
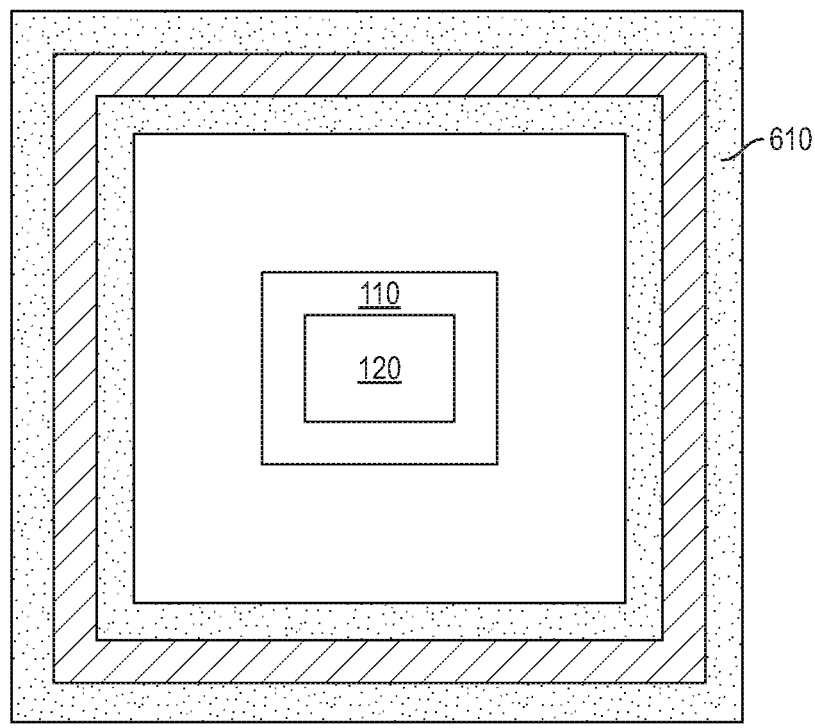

To prepare device wafer 100 for sealing, layers of Aluminum and Germanium are deposited on Silicide region 610. The Aluminum and Germanium layers are subsequently patterned and etched to form a structure. FIGS. 13A and 13B respectively are cross-sectional and top views of device wafer 100 after it has been processed, as described above, to include cavity 110, MEMS device 120, Silicide region 610 and structure 280 that includes an Aluminum layer 250 and a Germanium layer 260.

Figure 14:
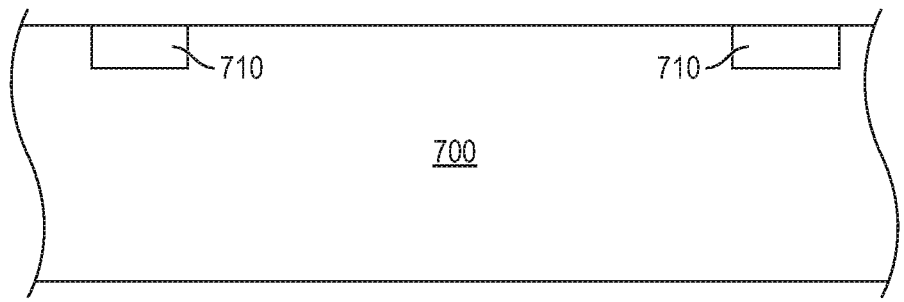
FIG. 14 is a cross-sectional view of a lid wafer adapted to cover the device wafer of FIG. 13A, in accordance with one exemplary embodiment of the present invention.

FIG. 14 is a cross-sectional view of an exemplary embodiment of a lid wafer 700 adapted to cover device wafer 100 of FIGS. 13A-13B to hermetically seal cavity 110 and device 120, in accordance with one exemplary embodiment of the present invention. Lid wafer 700 is shown as including a Silicide region 710 formed in its substrate.

Figure 15:
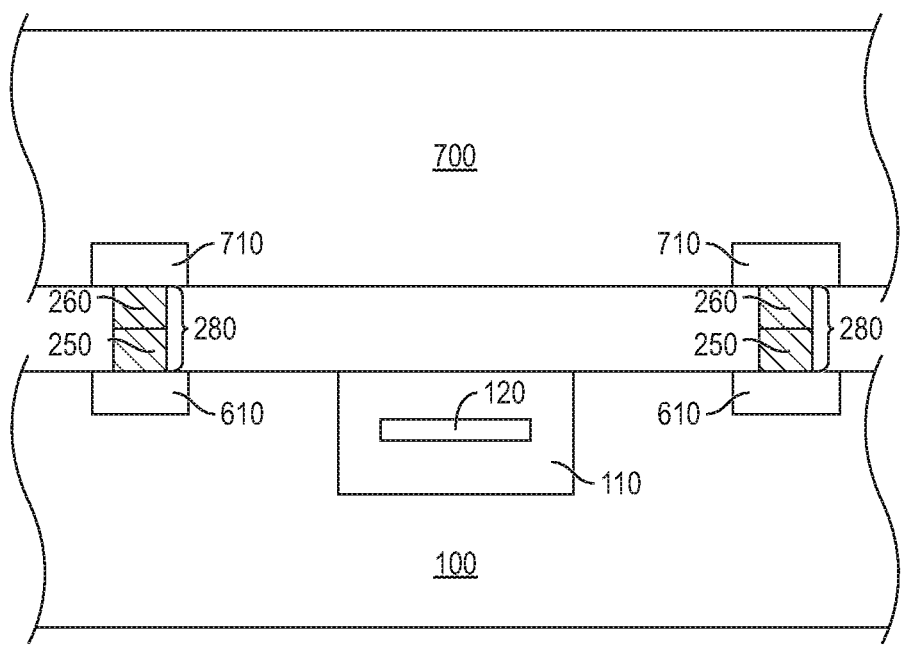
FIG. 15 is a cross-sectional view of the lid wafer of FIG. 14 covering the device wafer of FIG. 13A, in accordance with one exemplary embodiment of the present invention.

As seen from FIG. 15, to hermetically seal MEMS device 120, the top surface of device wafer 100—shown in FIGS. 13A, 13B—is brought into contact with the top surface of lid wafer 700—shown in FIG. 14. This is achieved by placing lid wafer 700 over device wafer 100 so as to bring Silicide regions 610 and 710 into alignment. Alternatively, to hermetically seal MEMS device 120, device wafer 100 may be placed over lid wafer 700.

To seal MEMS device 100, during a eutectic bonding when the required heat and pressure are applied, Aluminum and Germanium present in structure 280 change their phases from solid to liquid to form an AlGe eutectic melt which subsequently reacts with the Silicon atoms present in the Silicide region 610 and/or 710 to form a ternary AlGeSi. Incorporating Silicon atoms into the AlGe eutectic melt, in accordance with embodiments of the present invention, increases the eutectic point temperature thus solidifying the melt and controlling/limiting its flow.

Although device wafer 100 of FIGS. 13A, 13B is shown as including an Aluminum layer 250 above Silicide region 610, it is understood that in other embodiments, one or more layers that include other materials (not shown) may be present between Aluminum layer 250 and Silicide region 610. Furthermore, although device wafer 100 of FIGS. 13A and 13B is shown as including only a single layer of each Aluminum and Germanium, it is understood that in other embodiments (not shown), device wafer 100 may include multiple layers of Aluminum and Germanium deposited thereon in an alternating manner. Furthermore, although in the embodiment shown in FIG. 14, lid wafer 700 is shown as including only a Silicide region 710 formed in its substrate, it is understood that other embodiments of lid wafer 700 may include one or more layers disposed above Silicide region 710.

Figure 16:
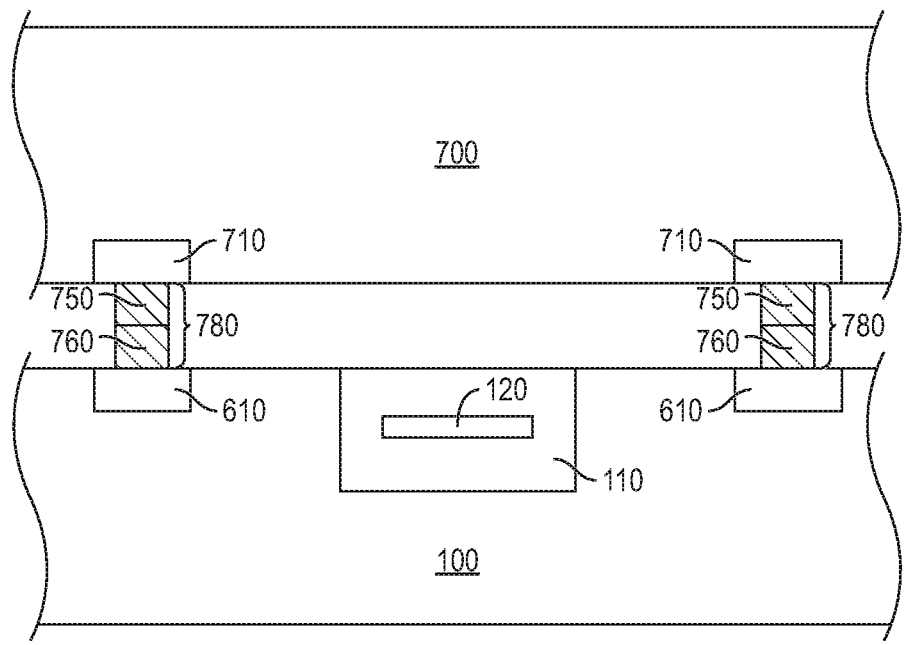
FIG. 16 is a cross-sectional view of a device wafer having a top surface that is covered by a lid wafer, in accordance with another exemplary embodiment of the present invention.

FIG. 16 is a cross-sectional view of a device wafer 100 having a top surface that is covered by lid wafer 700, in accordance with another exemplary embodiment of the present invention. The embodiment shown in FIG. 16 is similar to that shown in FIG. 15, except that in the embodiment of FIG. 16, structure 780 that includes an Aluminum layer 750 and a Germanium layer 760 is formed over Silicide region 710 of lid wafer 700 and not on the device wafer 100. Device wafer 100 is shown as including a silicide region 610, as well as MEMS device 120 formed in cavity 110.

To seal MEMS device 100, during a eutectic bonding when the required heat and pressure are applied, Aluminum and Germanium present in structure 280 change their phases from solid to liquid to form an AlGe eutectic melt which subsequently reacts with the Silicon atoms present in the Silicide region 610 and/or 710 to form a ternary AlGeSi. Incorporating Silicon atoms into the AlGe eutectic melt, in accordance with embodiments of the present invention, increases the eutectic point temperature thus solidifying the melt and controlling/limiting its flow.

Although lid wafer 700 of FIG. 16 is shown as including an Aluminum layer 750 and a Germanium layer 760 above Silicide region 710, it is understood that in other embodiments, one or more layers that include other materials (not shown) may be present between Aluminum layer 750 and Silicide region 710. Furthermore, although lid wafer 700 of FIG. 16 is shown as including only a single layer of each Aluminum and Germanium, it is understood that in other embodiments (not shown), lid wafer 700 may include multiple layers of Aluminum and Germanium deposited thereon in an alternating manner. Moreover, although in the embodiment shown in FIG. 16, device wafer 100 is shown as including only a Silicide region 610 formed in its substrate, it is understood that other embodiments of device wafer 100 may include one or more layers disposed above Silicide region 610.

Figure 17:
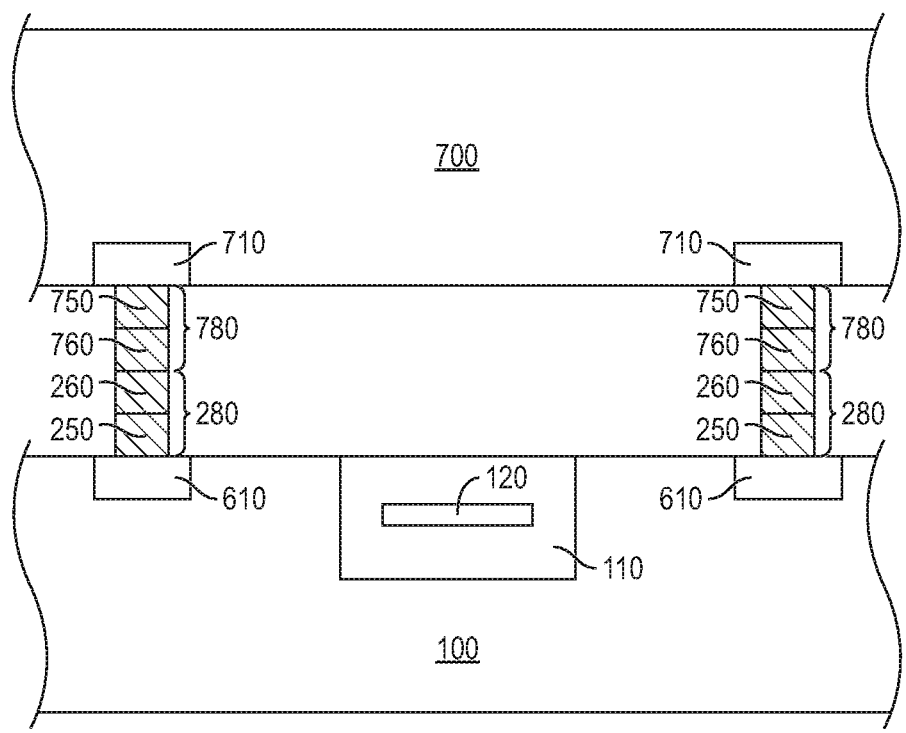
FIG. 17 is a cross-sectional view of a device wafer having a top surface that is covered by a lid wafer, in accordance with another exemplary embodiment of the present invention.

FIG. 17 is a cross-sectional view of a device wafer 100 having a top surface that is covered by lid wafer 700, in accordance with another exemplary embodiment of the present invention. Device wafer 100 is shown as including an aluminum layer 250 as well as a Germanium layer 260 that collectively form an AlGe structure 280 disposed above silicide region 610 of device wafer 100. Device wafer 100 is also shown as including, in part, a MEMS device 120 formed in cavity 120. Lid wafer 700 is shown as including an aluminum layer 750 and a Germanium layer 760 that collectively form an AlGe structure 780 disposed above silicide region 710 of lid wafer 700.

To seal MEMS device 100, during a eutectic bonding when the required heat and pressure are applied, Aluminum and Germanium change from solid to liquid so as to form an AlGe eutectic melt. The AlGe eutectic melt reacts with the Silicon atoms present in the Silicide region 610 and/or Silicide region 710 to form a ternary AlGeSi. Incorporating the Si atoms into the AlGe eutectic melt, in accordance with embodiments of the present invention, increases the eutectic point temperature thus solidifying the melt while controlling and limiting its flow.

Although not shown in FIG. 17, it is understood that Silicide regions 610 and 710 may be formed above their respective substrate surfaces, as shown for example, in FIG. 11. Furthermore, although not shown, one or more layers of other materials may be disposed between Silicide region 610 and Aluminum layer 250 of device wafer 100, and/or between the Silicide region 710 and Aluminum layer 750 of lid wafer 700. Furthermore, although the embodiment of FIG. 17 is shown as including only a single layer of each Aluminum and Germanium on each of the device and lid wafers, it is understood that in other embodiments (not shown), both the device and lid wafers may include multiple layers of Aluminum and Germanium deposited thereon in an alternating manner.

Figure 18:
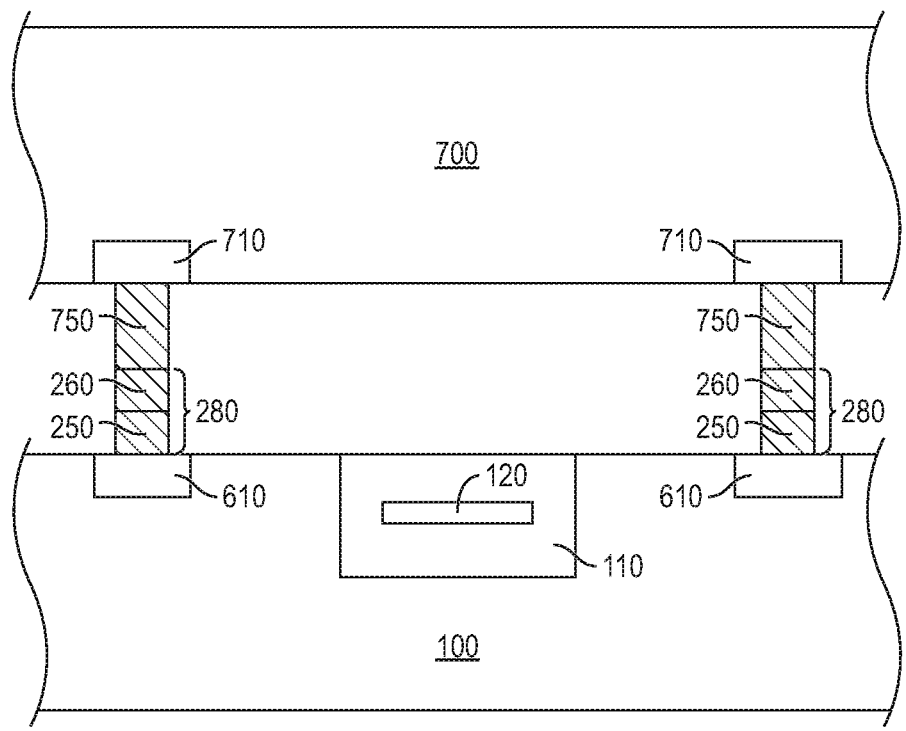
FIG. 18 is a cross-sectional view of a device wafer having a top surface that is covered by a lid wafer, in accordance with another exemplary embodiment of the present invention.

FIG. 18 is a cross-sectional view of a device wafer 100 having a top surface that is covered by lid wafer 700, in accordance with yet another exemplary embodiment of the present invention. Device wafer 100 is shown as including an Aluminum layer 250 as well as a Germanium layer 260 that are patterned and etched to collectively form an AlGe step structure 280 disposed above silicide region 610 of device wafer 100. Device wafer 100 is also shown as including, in part, a MEMS device 120 formed in cavity 120. Lid wafer 700 is shown as including a Germanium layer 750 disposed above silicide region 710 of lid wafer 700.

To seal MEMS device 100, during a eutectic bonding when the required heat and pressure are applied, Aluminum and Germanium change their phases from solid to liquid to form an AlGe eutectic melt which subsequently reacts with the Silicon atoms present in the Silicide region 610 and/or 710 to form a ternary AlGeSi. Incorporating the Si atoms into the AlGe eutectic melt, in accordance with embodiments of the present invention, increases the eutectic point temperature thus solidifying the melt while controlling and limiting its flow.

Although not shown in FIG. 17, it is understood that Silicide regions 610 and 710 may be formed above their respective substrate surfaces, as shown for example, in FIG. 11. Furthermore, although not shown, one or more layers of other materials may be disposed between Silicide region 610 and Aluminum layer 250 of device wafer 100, and/or between the Silicide region 710 and Germanium layer 750 of lid wafer 700. Furthermore, although the embodiment of FIG. 17 is shown as including only a single layer each of Aluminum and Germanium on each of the device and lid wafers, it is understood that in other embodiments (not shown), both the device and lid wafers may include multiple layers of Aluminum and Germanium deposited thereon in an alternating manner.

Figure 19:
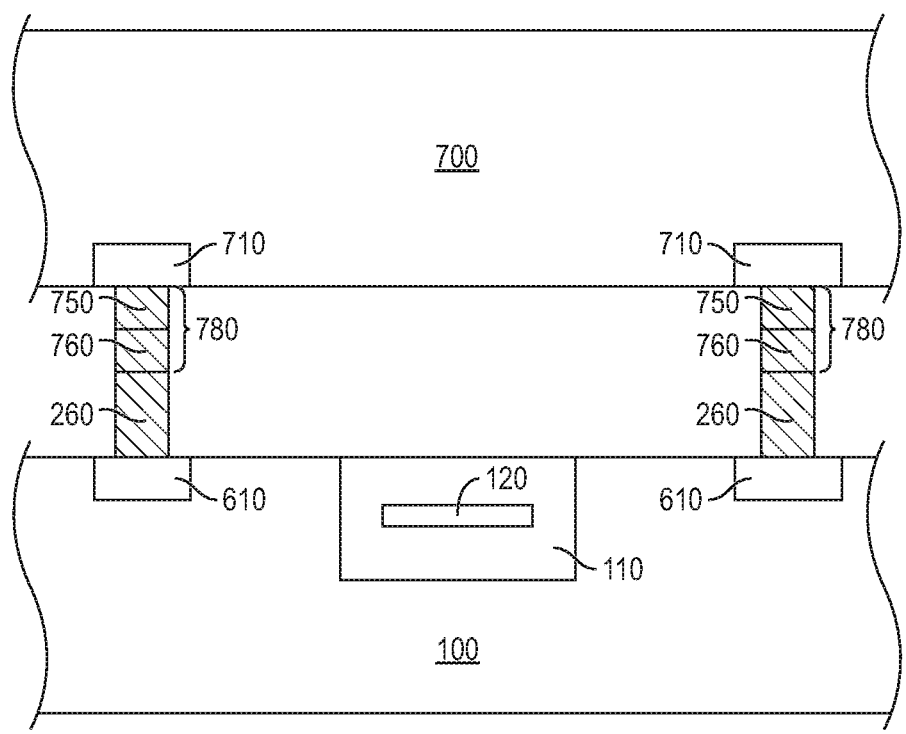
FIG. 19 is a cross-sectional view of a device wafer having a top surface that is covered by a lid wafer, in accordance with another exemplary embodiment of the present invention.

FIG. 19 is a cross-sectional view of a device wafer 100 having a top surface that is covered by lid wafer 700, in accordance with another exemplary embodiment of the present invention. Device wafer 100 is shown as including a Germanium layer 260 formed above its Silicide region 610. Device wafer 100 is also shown as including, in part, a MEMS device 120 formed in cavity 120. Lid wafer 700 is shown as including an aluminum layer 750 as well as a Germanium layer 760 that are patterned and etched to collectively form an AlGe structure 780 disposed above Silicide region 710 of lid wafer 700.

To seal MEMS device 100, during a eutectic bonding when the required heat and pressure are applied, Aluminum and Germanium change their phases from solid to liquid to form an AlGe eutectic melt which subsequently reacts with the Silicon atoms present in the Silicide region 610 and/or 710 to form a ternary AlGeSi. Incorporating the Si atoms into the AlGe eutectic melt, in accordance with embodiments of the present invention, increases the eutectic point temperature thus solidifying the melt while controlling and limiting its flow.

Although not shown in FIG. 19, it is understood that Silicide regions 610 and 710 may be formed above their respective substrate surfaces, as shown for example, in FIG. 11. Furthermore, although not shown, one or more layers of other materials may be disposed between Silicide region 610 and Germanium structure 260 of device wafer 100, and/or between the Silicide region 710 and Aluminum layer 750 of lid wafer 700. Furthermore, although the embodiment of FIG. 19 is shown as including only a single layer each of Aluminum and Germanium on lid wafer 700, it is understood that in other embodiments (not shown), the lid wafer may include multiple layers of Aluminum and Germanium deposited thereon in an alternating manner.

Figure 20:
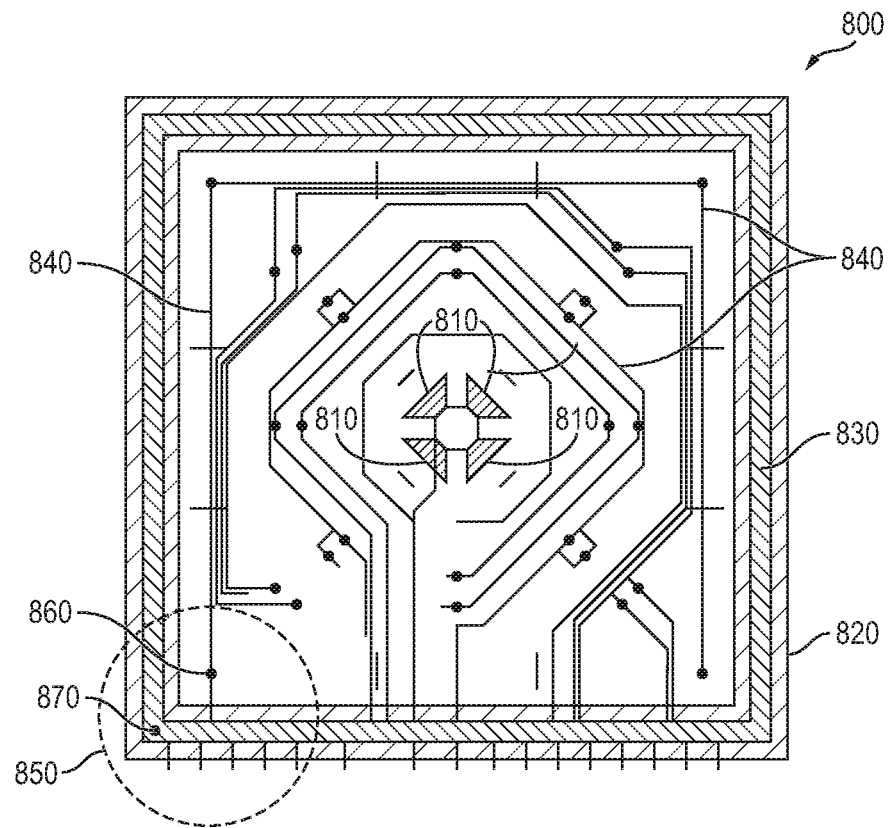
FIG. 20 is a simplified top layout view of a MEMS device, in accordance with one exemplary embodiment of the present invention.

FIG. 20 is a simplified top layout view of a MEMS device 800, in accordance with one exemplary embodiment of the present invention. Disposed near the center of MEMS 800 are drive masses 810. Formed along the periphery of the device is a Silicide layer 810. Positioned above the Silicide layer is the Aluminum Germanium stack layer 830. Also shown are a multitude of routing interconnects 830 formed from, for example, TiN/Al/TiN stack layer 840. Also shown in FIG. 20 is area 870 within which two regions, namely 850 and 870 of TiN/Al/TiN are identified. The Alumina layer (not shown in these Figures) in these two regions have openings to provide electrical connection between undelaying Silicide layer 230 and overlaying Aluminum Germanium stack layer 830.

Figure 21:
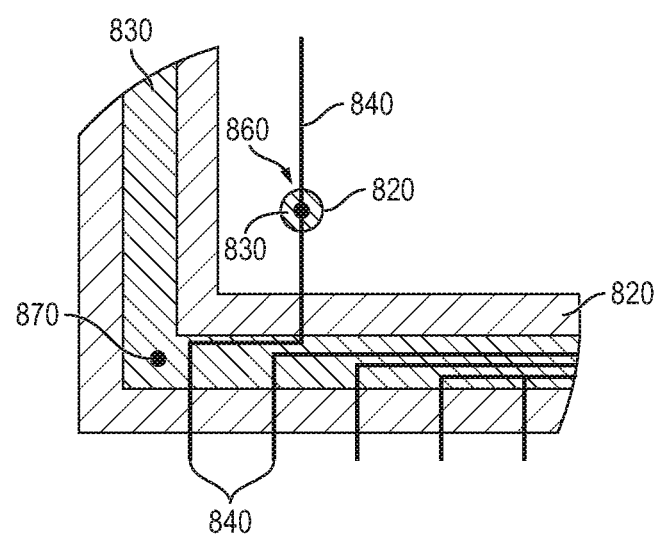
FIG. 21 provides a more detailed view of an area of the MEMS device of FIG. 20, in accordance with one exemplary embodiment of the present invention.
Figure 22A:
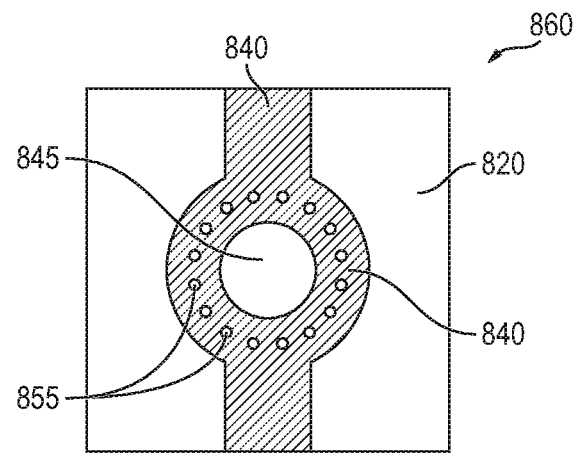
FIGS. 22A and 22B provide more detailed views of a number of the layers within area identified FIG. 21, in accordance with one exemplary embodiment of the present invention.
Figure 22B:
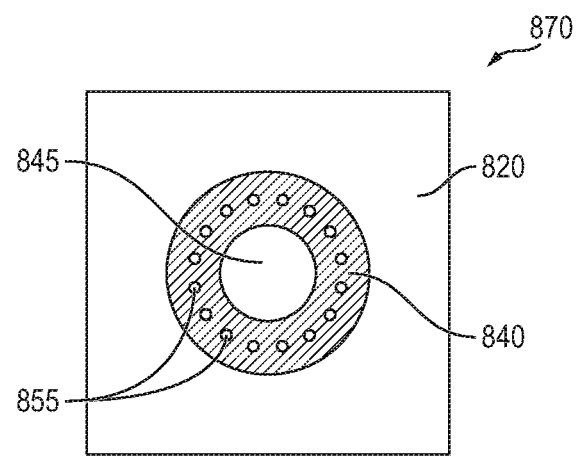

FIG. 21 provides a more detailed view of the structure shown in region 860 of FIG. 20. Region 860 is shown as including a Silicide layer 820, an Aluminum Germanium stack layer 830 and a TiN/Al/TiN stack routing layer 840. Region 870 is shown as including a circular TiN/Al/TiN stack layer 840. FIG. 22A provides a more detailed view of region 860 showing opening 845 formed in the Alumina layer. For simplicity, Aluminum Germanium stack layer 830 and the Alumina layer are not shown in FIG. 22A. Also shown in FIG. 22A are Tungsten via plugs with TiN liner 855. FIG. 22B provides a more detailed view of region 870 showing opening 845 formed in the Alumina layer. For simplicity, Aluminum Germanium stack layer 830 and the Alumina layer are not shown in FIG. 22B. Also shown in FIG. 22B are Tungsten via plugs with TiN liner 855.

The above embodiments of the present invention are illustrative and not limitative. Embodiments of the present invention are not limited by the type of MEMS device. Embodiments of the present invention are not limited by the type of deposition, patterning, etching, and other semiconductor processing steps required to form the various layers and structures described herein. Embodiments of the present invention are not limited to any specific thicknesses of the layers described herein. Embodiments of the present invention are not limited to the materials/layers described above. Accordingly, it is understood that other semiconductor materials may be present between the various layers described above. Other additions, subtractions or modifications are obvious in view of the present disclosure and are intended to fall within the scope of the appended claims.

What is claimed is:

1. A method of sealing a MEMS device formed in a first semiconductor substrate using a second semiconductor substrate, the method comprising:
    forming an Aluminum Germanium structure above the first substrate;
    forming a polysilicon layer above the second substrate;
    covering the first substrate with the second substrate so as to cause the polysilicon layer to contact the Aluminum Germanium structure; and
    performing eutectic bonding between the first and second substrates so as to cause the Aluminum Germanium structure to melt and form a AlGeSi sealant thereby to seal the MEMS device.

2. The method of claim 1 further comprising:
    forming an adhesive layer below the Aluminum Germanium structure in the first substrate.

3. The method of claim 2 further comprising:
    forming an Alumina layer between the Aluminum Germanium structure and the adhesive layer.

4. The method of claim 2 wherein said adhesive layer is a Titanium Nitride layer.

5. The method of claim 1 further comprising:
    forming an Alumina layer below the Polysilicon layer in the second substrate.

6. The method of claim 5 further comprising:
    forming an adhesive layer below the Alumina layer in the second substrate.

7. The method of claim 1 wherein said Germanium Aluminum structure comprises a layer of Germanium overlaying a layer of Aluminum.

8. The method of claim 1 further comprising:
    forming a Polycide layer below the Polysilicon layer in the second substrate.

9. The method of claim 1 wherein said Aluminum Germanium structure comprises a layer of Germanium overlaying a layer of Aluminum, wherein said Aluminum layer comprises Copper atoms.

10. The method of claim 1 wherein said Aluminum Germanium structure comprises a layer of Aluminum and Germanium that are co-deposited.

11. A method of sealing a MEMS device formed in a first semiconductor substrate using a second semiconductor substrate, the method comprising:
forming a Silicide layer either in or above the first substrate;
forming an Aluminum Germanium structure above the Silicide layer of the first substrate;
forming a Silicide layer either in or above a substrate of the second substrate;
covering the first substrate with the second substrate so as to cause the Aluminum Germanium structure of the first substrate to contact the Silicide layer of the second substrate; and
performing eutectic bonding between the first and second substrates so as to cause the Aluminum Germanium structure to melt and form a AlGeSi sealant thereby to seal the MEMS device.

12. A method of sealing a MEMS device formed in a first semiconductor substrate using a second semiconductor substrate, the method comprising:
forming a Silicide layer either in or above the first substrate;
forming a Silicide layer either in or above the second substrate;
forming an Aluminum Germanium structure above the Silicide layer of the second substrate;
covering the first substrate with the second substrate so as to cause the Aluminum Germanium structure of the second substrate to contact the Silicide layer of the first substrate; and
performing eutectic bonding between the first and second substrates so as to cause the Aluminum Germanium structure to melt and form a AlGeSi sealant thereby to seal the MEMS device.

13. A method of sealing a MEMS device formed in a first semiconductor substrate using a second semiconductor substrate, the method comprising:
forming a Silicide layer either in or above a substrate of the first substrate;
forming an Aluminum Germanium structure above the Silicide layer of the first substrate;
forming a Silicide layer either in or above a substrate of the second substrate;
forming an Aluminum Germanium structure above the Silicide layer of the second substrate;
covering the first substrate with the second substrate so as to cause the Aluminum Germanium structure of the first substrate to contact the Aluminum Germanium structure of the first substrate; and
performing eutectic bonding between the first and second substrates so as to cause the Aluminum Germanium structure to melt and form a AlGeSi sealant thereby to seal the MEMS device.

14. A method of sealing a MEMS device formed in a first semiconductor substrate using a second semiconductor substrate, the method comprising:
forming a Silicide layer either in or above a substrate of the first substrate; forming an Aluminum Germanium structure above the Silicide layer of the first substrate;
forming a Silicide layer either in or above a substrate of the second substrate; forming an Aluminum structure above the Silicide layer of the second substrate;
covering the first substrate with the second substrate so as to cause the Aluminum Germanium structure of the first substrate to contact the Aluminum structure of the second substrate; and
performing eutectic bonding between the first and second substrates so as to cause the Aluminum Germanium structure to melt and form a AlGeSi sealant thereby to seal the MEMS device.

15. A method of sealing a MEMS device formed in a first semiconductor substrate using a second semiconductor substrate, the method comprising:
forming a Silicide layer either in or above a substrate of the first substrate;
forming a Germanium structure above the Silicide layer of the first substrate;
forming a Silicide layer either in or above a substrate of the second substrate;
forming an Aluminum Germanium structure above the Silicide layer of the second substrate;
covering the first substrate with the second substrate so as to cause the Aluminum Germanium structure of the second substrate to contact the Germanium structure of the first substrate; and
performing eutectic bonding between the first and second substrates so as to cause the Aluminum Germanium structure to melt and form a AlGeSi sealant thereby to seal the MEMS device.

* * * * *